United States Patent
Lee et al.

(10) Patent No.: US 9,214,925 B2
(45) Date of Patent: Dec. 15, 2015

(54) CLOCK GATED CIRCUIT AND DIGITAL SYSTEM HAVING THE SAME

(75) Inventors: Hoijin Lee, Seoul (KR); Bai-Sun Kong, Suwon-si (KR)

(73) Assignees: SAMSUNG ELECTRONICS CO., LTD., Suwon-Si, Gyeonggi-Do (KR); SUNGKYUNKWAN UNIVERSITY FOUNDATION FOR CORPORATE, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/440,007

(22) Filed: Apr. 5, 2012

(65) Prior Publication Data

US 2012/0268182 A1    Oct. 25, 2012

(30) Foreign Application Priority Data

Apr. 22, 2011 (KR) .................. 10-2011-0037963

(51) Int. Cl.
*H03L 5/00* (2006.01)
*H03K 3/356* (2006.01)

(52) U.S. Cl.
CPC ............................... *H03K 3/356121* (2013.01)

(58) Field of Classification Search
USPC .......... 327/211, 212, 33, 333; 326/63, 68, 80, 326/81; 365/189.11
See application file for complete search history.

(56) References Cited

U.S. PATENT DOCUMENTS

| 6,768,368 B2* | 7/2004 | Kaneko et al. ................. 327/333 |
| 8,258,848 B2* | 9/2012 | Chen .............................. 327/333 |
| 2008/0238514 A1* | 10/2008 | Kim ................................. 327/212 |
| 2010/0109747 A1 | 5/2010 | Datta et al. |
| 2010/0201344 A1 | 8/2010 | Kim |

FOREIGN PATENT DOCUMENTS

| JP | 11-074764 | 3/1999 |
| JP | 11-103240 | 4/1999 |
| KR | 100853649 | 8/2008 |

* cited by examiner

*Primary Examiner* — Long Nguyen
(74) *Attorney, Agent, or Firm* — F. Chau & Associates, LLC

(57) ABSTRACT

A clock gated circuit includes a pulse generator and a pulse level shifter. The pulse generator is driven by a first power supply voltage and is configured to receive a clock signal to generate a pulse and an inverted pulse. The pulse level shifter is driven by a second power supply voltage higher than the first power supply voltage and is configured to receive the pulse and the inverted pulse and to convert a level of the pulse in response to an enable signal.

19 Claims, 10 Drawing Sheets

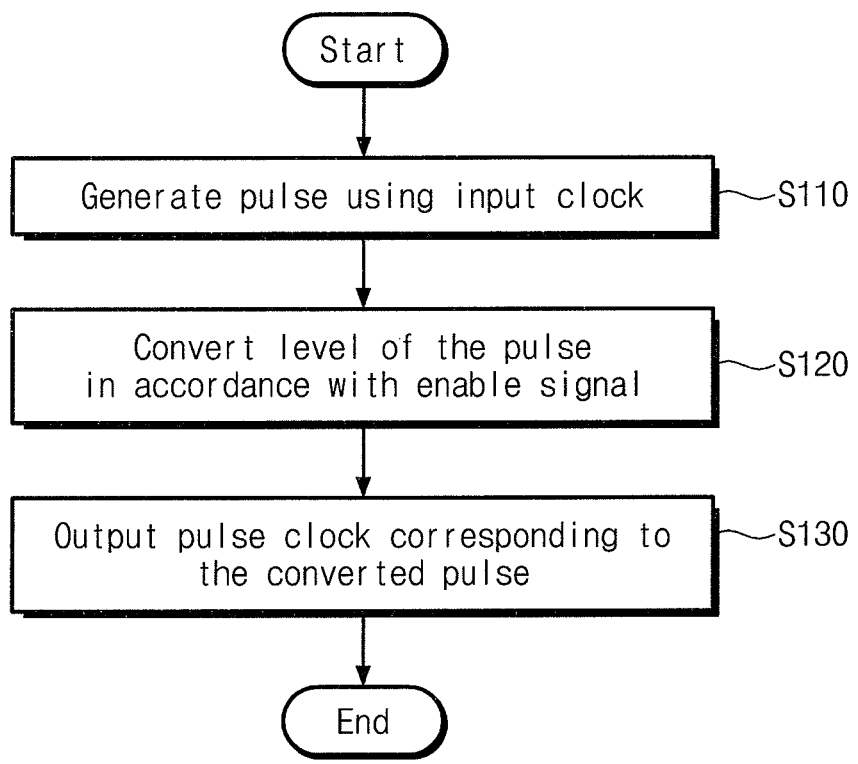

CLOCK GATED CIRCUIT AND DIGITAL SYSTEM HAVING THE SAME

CROSS-REFERENCE TO RELATED APPLICATIONS

This application claims priority under 35 U.S.C §119 to Korean Patent Application No. 10-2011-0037963, filed Apr. 22, 2011, the disclosure of which is incorporated by reference herein.

1. Technical Field

Exemplary embodiments of the inventive concept relate to a clock gated circuit and a digital system including the same.

2. Discussion of Related Art

A digital system may include combinational and sequential circuits. A combinational circuit may include logic gates. Outputs of the logic gates may be determined sequentially according to values input to the logic gates. A combinational circuit may perform an information processing operation logically and be characterized by a corresponding Boolean expression. A sequential circuit may include storage elements such as latches in addition to logic gates. Outputs of the storage elements may be based on inputs and states of the storage elements. The states of the storage elements may be based on previous inputs. Accordingly, outputs of the sequential circuit may follow not only current input values but also previous input values and an operation of the sequential circuit may be characterized by a time sequence of internal states and inputs.

Digital systems using latches may include registers, counters, static memory arrays, etc. Implementations of high-speed and low-power digital systems may be dependent on the type of latches used.

SUMMARY

According to an exemplary embodiment of the inventive concept, a clock gated circuit includes a pulse generator and a pulse level shifter. The pulse generator is driven by a first power supply voltage and is configured to receive a clock signal to generate a pulse and an inverted pulse. The pulse level shifter is driven by a second power supply voltage higher than the first power supply voltage and is configured to receive the pulse and the inverted pulse and to convert a level of the pulse in response to an enable signal.

The amplitude of the clock signal may be the same as the first power supply voltage. The amplitude of the enable signal may be the same as the second power supply voltage. The amplitude of the enable signal may be the same as the first power supply voltage. The amplitude of the converted pulse may be the same as the second power supply voltage.

The pulse generator may include a plurality of inverters connected in series and configured to generate a delay clock signal by delaying the clock signal, a logic circuit configured to output the inverted pulse by NANDing the clock signal and the delay clock signal, and an inverter configured to output the pulse by inverting the inverted pulse.

The pulse level shifter may interrupt a current path at an overlap period of the pulse and the inverted pulse. The pulse generator may include a plurality of inverters connected in series and configured to generate a delay clock signal by delaying the clock signal, a logic circuit configured to output the inverted pulse by XNORing the clock signal and the delay clock signal, and an inverter configured to output the pulse by inverting the inverted pulse.

In an alternate embodiment, the pulse level shifter may include a first PMOS transistor connected between the second power supply voltage and a current path node and having a gate connected to an inverted conversion node, a second PMOS transistor connected between the second power supply voltage and an inverted current path node and having a gate connected to a conversion node, a first inverter connected between the current path node and a bias node and configured to invert the pulse and to output the inverted result to the conversion node, a second inverter connected between the inverted current path node and a ground terminal and configured to invert the inverted pulse and to output the inverted result to the inverted conversion node, and an NMOS transistor connected between the bias node and the ground terminal and having a gate connected to receive the enable signal.

A high-level period of the pulse may be shorter than a half period of the clock. A high-level interval of the enable signal may be shorter than a period of the clock signal.

The pulse level shifter in an alternate embodiment may include a first PMOS transistor connected between the second power supply voltage and a conversion node and having a gate connected to an inverted conversion node, a second PMOS transistor connected between the second power supply voltage and the conversion node and having a gate connected to the conversion node, a first NMOS transistor connected between the conversion node and a bias node and having a gate connected to receive the pulse, a second NMOS transistor connected between the inverted conversion node and a ground terminal and having a gate connected to receive the inverted pulse, and an NMOS transistor connected between the bias node and the ground terminal and having a gate connected to receive the enable signal.

A high-level interval of the enable signal may be longer than a half period of the clock. The clock gated circuit may further include an output unit configured to output a pulse clock corresponding to the converted pulse.

According to an exemplary embodiment of the inventive concept, a digital system includes a plurality of clock gated circuits and a plurality of flip-flops. Each clock gate circuit is configured to receive a clock signal having the amplitude of a first power supply voltage and to generate a pulse clock signal having the amplitude of a second power supply voltage. The first power supply voltage is lower than the second power supply voltage. The flip-flops are connected with the clock gated circuits and are configured to latch data in response to the pulse clock. Each of the clock gated circuits receives the clock signal, generates a pulse and an inverted pulse and generates the pulse clock signal in response to the pulse and the inverted pulse by converting a level of the pulse in response to an enable signal.

The digital system may include a clock buffer layer configured to receive a root clock signal and divide the root clock signal into a number of signals corresponding to a count of the clock gated circuits, where the clock signal received by each clock gated circuit is a distinct one of the numbered signals.

According to an exemplary embodiment of the invention, a clock gated circuit includes a pulse generator and a pulse level shifter. The pulse generator is configured to receive a clock signal to output first and second pulses. The second pulse is the first pulse inverted and delayed. The amplitude of each pulse is a first voltage, and a high-level period of the second pulse is shorter than a half period of the clock signal. The pulse level shifter is configured to receive the first and second pulses to output a pulse clock signal having a second voltage higher than the first voltage level.

The pulse level shifter may perform a level shifting in response to receipt of an enable signal having a high level for a period greater than a half period of the clock signal.

The pulse level shifter may include a first PMOS transistor and a first inverter connected in series between the second voltage and a ground voltage; and a second PMOS transistor, a second inverter, and an NMOS transistor connected in series between the second voltage and the ground voltage, where a gate of the first PMOS transistor is connected to an output of the second inverter, a gate of the second PMOS transistor is connected to an output of the first inverter, the first pulse is output to an input of the first inverter, the second pulse is output to an input of the second inverter, and the enable signal is output to a gate of the NMOS transistor.

In an alternate embodiment, the pulse level shifter includes a first PMOS transistor and a first NMOS transistor connected in series between the second voltage and a ground voltage; a second PMOS transistor, second NMOS transistor, and third NMOS transistor connected in series between the second voltage and the ground voltage, where a gate of the first PMOS transistor is connected to an output terminal of the second PMOS transistor and an input terminal of the third NMOS transistor, a gate of the second PMOS transistor is connected to an output terminal of the first PMOS transistor and an input terminal of the first NMOS transistor, the first pulse is output to a gate of the first NMOS transistor and the second pulse is output to a gate of the second NMOS transistor, and the enable signal is output to a gate of the third NMOS transistor.

BRIEF DESCRIPTION OF THE FIGURES

Embodiments of the inventive concept will become apparent from the following description with reference to the following figures, wherein like reference numerals refer to like parts throughout the various figures unless otherwise specified.

FIG. 10 is a flowchart for describing a pulse clock generating method of a clock gated circuit according to an exemplary embodiment of the inventive concept.

DETAILED DESCRIPTION

Figure 1:
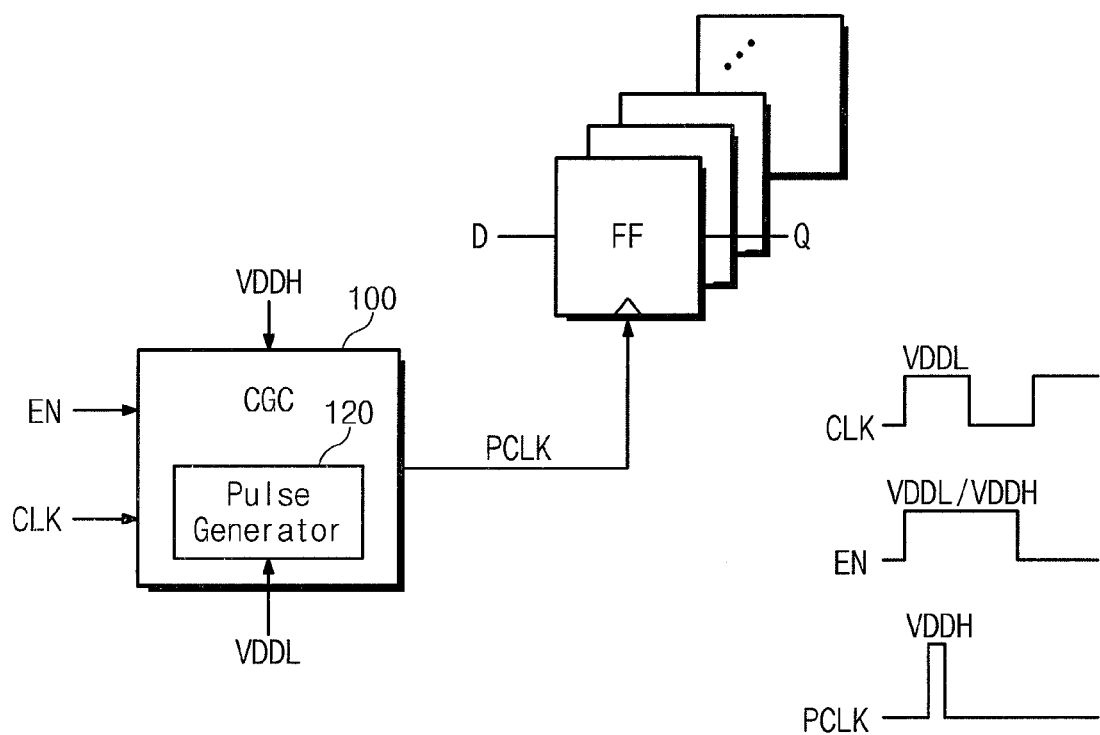
FIG. 1 is a block diagram illustrating a clock gated circuit according to an exemplary embodiment of the inventive concept.

The inventive concept is described more fully hereinafter with reference to the accompanying drawings, in which exemplary embodiments thereof are shown. This inventive concept may, however, be embodied in many different forms and should not be construed as limited to the exemplary embodiments set forth herein. In the drawings, the size and relative sizes of layers and regions may be exaggerated for clarity. Like numbers refer to like elements throughout.

As used herein, the singular forms "a", "an" and "the" are intended to include the plural forms as well, unless the context clearly indicates otherwise. It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a clock gated circuit according to an exemplary embodiment of the inventive concept. Referring to FIG. 1, a clock gated circuit 100 is configured to receive a clock signal CLK and to generate a pulse clock signal PCLK in response to an enable signal EN. The clock gated circuit 100 includes a pulse generator 120, which generates a pulse. The pulse generator 120 may be driven by a first power supply voltage VDDL, and the generated pulse may have the amplitude of the first power supply voltage VDDL.

In an exemplary embodiment, the clock signal CLK has the amplitude of the first power supply voltage VDDL.

In an exemplary embodiment, the enable signal EN has the same amplitude as the first power supply voltage VDDL or a second power supply voltage VDDH. As an example, an active interval (e.g., a high-level interval) of the enable signal EN illustrated in FIG. 1 may be longer than a half period of the clock signal CLK and shorter than a period of the clock signal CLK. However, the active interval of the enable signal EN is not limited thereto. In an embodiment, the first power supply voltage VDDL has a lower voltage level than the second power supply voltage VDDH. For example, the first power supply voltage VDDL may be 0.9V, and the second power supply voltage VDDH may be 1.045V. However, embodiments of the invention are not limited to any particular first power supply voltage VDDL or second power supply voltage.

In an embodiment, the remaining elements of the clock gated circuit 100 other than the pulse generator 120 are driven by the second power supply voltage VDDH. The clock gated circuit 100 may output the pulse clock signal PCLK using the pulse generated by the pulse generator 120. In an embodiment, the pulse clock signal PCLK has the amplitude of the second power supply voltage VDDH.

In an exemplary embodiment, an active interval (e.g., a period having a level of the second power supply voltage VDDH) of the pulse clock signal PCLK may be shorter than a half period of the clock signal CLK.

Referring to FIG. 1, the pulse clock signal PCLK generated from the clock gated circuit 100 may be applied to at least one flip-flop FF. The flip-flop FF may latch data D in response to the pulse clock signal PCLK.

The clock gated circuit 100 may improve the performance of the flip-flop FF by providing the flip-flop FF with the pulse clock signal PCK having the amplitude of the second power supply voltage VDDH, which is higher than that of the first power supply voltage VDDL.

Since the clock gated circuit 100 is driven by the first power supply voltage VDDL, it may be possible to reduce power consumption of a system including the clock gated circuit 100.

The clock gated circuit 100 according to an exemplary embodiment of the inventive concept may convert a clock signal CLK having the amplitude of the first power supply voltage VDDL into the pulse clock PCLK having the amplitude of the second power supply voltage VDDH. Accordingly, the clock gated circuit 100 may improve the performance of a flip-flop it drives and reduce power consumption.

A gated circuit 100 according to an exemplary embodiment of the inventive concept may generate the pulse clock signal PCLK having an active interval shorter than a half period of the clock signal CLK. Accordingly, the gated circuit 100 may reduce power consumption as compared with a gated circuit that generates a gated clock having an active interval that is identical to or more than a half period of a clock signal CLK.

Figure 2:
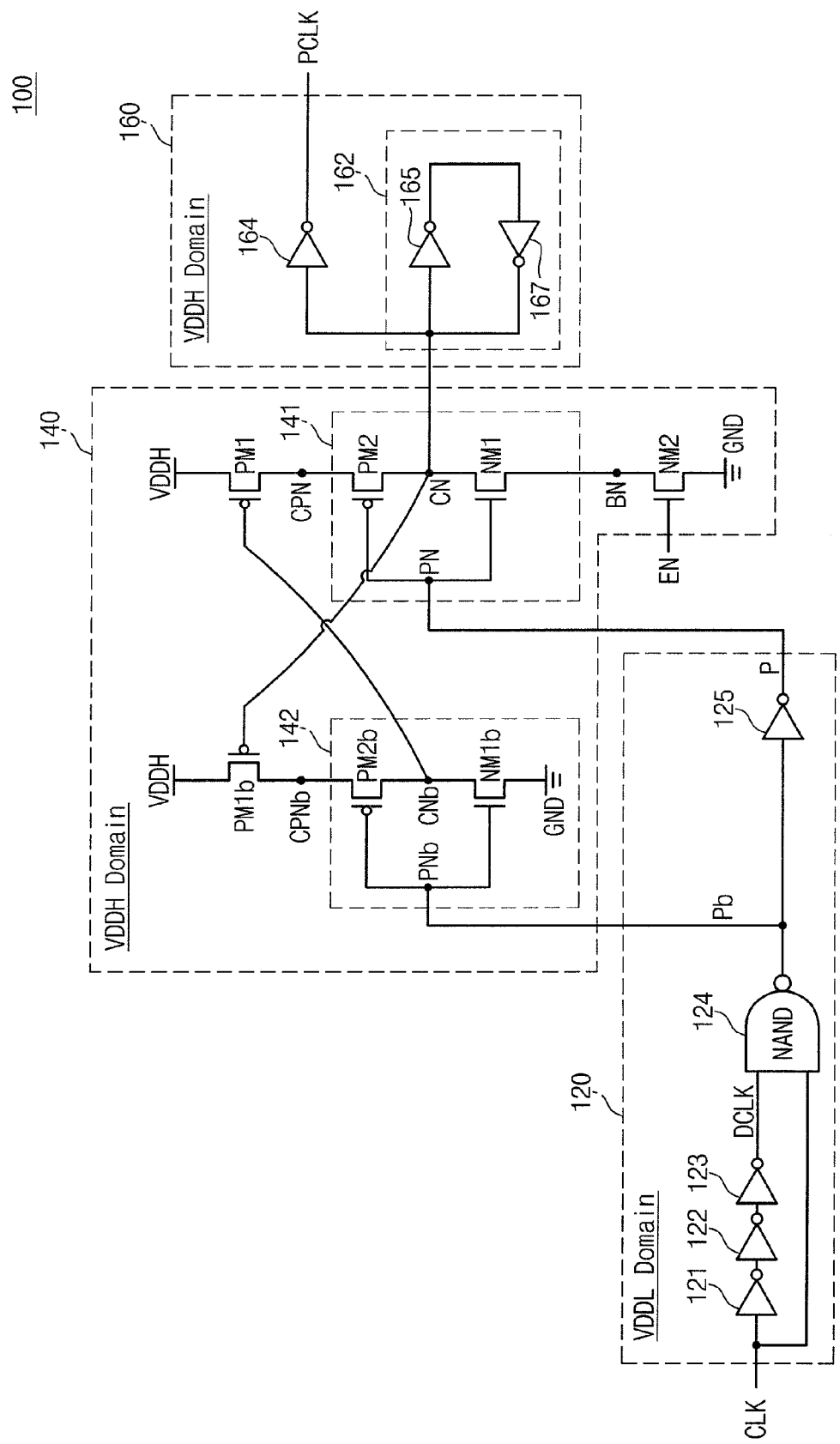
FIG. 2 is a circuit diagram illustrating a clock gated circuit in FIG. 1 according to an exemplary embodiment of the inventive concept.

FIG. 2 is a circuit diagram illustrating a clock gated circuit in FIG. 1 according to an exemplary embodiment of the inventive concept. Referring to FIG. 2, a clock gated circuit 100 includes a pulse generator 120, a pulse level shifter 140, and an output unit 160. In an embodiment, the pulse generator 120 is at a first power supply voltage (VDDL) domain, and the pulse level shifter 140 and the output unit 160 are at a second power supply voltage (VDDH) domain. The first power supply voltage domain may be a region driven by a first power supply voltage VDDL, and the second power supply voltage domain may be a region driven by a second power supply voltage VDDH.

The pulse generator 120 may receive a clock signal CLK to generate pulses P and Pb. The pulses P and Pb may be complementary and active intervals of the pulses P and Pb may be shorter than a half period of the clock signal CLK.

In an exemplary embodiment, the pulse generator 110 is configured to generate the pulse P and the inverted pulse Pb such that they have an overlap period. For example, during the overlap period, both the pulse P and inverted pulse Pb have the same high logic level. In another embodiment, the pulse generator 110 may be configured to generate the pulse P and the inverted pulse Pb such that there is no overlap period. For example, when there is no overlap period, the pulse P and inverted pulse Pb do not have the high level at the same time.

In an embodiment, the pulse generator 120 includes an odd number of inverters 121, 122, and 123 connected in series and generating a delay clock signal DCLK in response to the clock signal CLK, a logic circuit 124 NANDing the clock signal CLK and the delay clock signal DCLK, and an inverter 125 inverting an output of the logic circuit 124. While FIG. 2 illustrates three inverters being used to generate the delay clock signal DCLK, the inventive concept is not limited thereto. For example, the delay clock signal DCLK may be generated using at least one inverter.

In an embodiment, an output of the logic circuit 124 is the inverted pulse Pb, and an output of the inverter 125 is the pulse P.

In an embodiment, the pulse level shifter 140 receives the pulse P and the inverted pulse Pb and differentially converts a level of the pulse P in response to an enable signal EN. For example, the pulse level shifter 140 may convert a level of the pulse P having the amplitude of the first power supply voltage VDDL into a pulse having the amplitude of the second power supply voltage VDDH.

In an embodiment, the pulse level shifter 140 includes first and second PMOS transistors PM1 and PM1b, a first inverter 141, a second inverter 142, and an NMOS transistor NM2. The first transistor PM1 is connected between the second power supply voltage VDDH and a current path node CPN. The second transistor PM1b is connected between the second power supply voltage VDDH and an inverted current path node CPNb. The first inverter 141 is connected between the current path node CPN and a bias node BN. The second inverter 142 is connected between the inverted current path node CPNb and a ground terminal GND. The NMOS transistor NM2 is connected between the bias node BN and the ground terminal GND. The first and second PMOS transistors PM1 and PM1b may be cross coupled. For example, a gate of the first PMOS transistor PM1 may be connected to an output of the second PMOS transistor PM1b and a gate of the second PMOS transistor PM1b may be connected to an output of the first PMOS transistor PM1. In an embodiment, the first inverter 141 receives the pulse P, and the second inverter 142 receives the inverted pulse Pb. In an embodiment, a gate of the second PMOS transistor PM1b is connected with an output of the first inverter 141, and a gate of the first PMOS transistor PM1 is connected with an output of the second inverter 142. In an embodiment, the enable signal EN is applied to a gate of the NMOS transistor NM2.

In an embodiment, the first inverter 141 includes a PMOS transistor PM2 and an NMOS transistor NM1 connected in series between the current path node CPN and the bias node BN. In an embodiment, the pulse P is applied to gates of the PMOS and NMOS transistors PM2 and NM1. In an embodiment, a conversion node CN of the first inverter 141 outputs a pulse having a converted level of the pulse P. For example, the pulse P input to the first inverter 141 may have the amplitude of the first power supply voltage VDDL, and the pulse output from the first inverter 141 may have the amplitude of the second power supply voltage VDDH.

In an embodiment, the second inverter 142 includes a PMOS transistor PM2b and an NMOS transistor NM1b connected in series between the current path node CPNb and the ground terminal GND. In an embodiment, the inverted pulse Pb is applied to gates of the PMOS and NMOS transistors PM2b and NM1b.

In an embodiment, the pulse level shifter 140 has a differential level shifter structure and includes current paths formed of the inverters 141 and 142. The current paths formed of the inverters 141 and 142 may reduce or prevent a short current. A short current may refer to a current flowing via the current paths when the pulse P and the inverted pulse Pb have a high level at the same time (e.g., the overlap period).

A method of using the current paths formed of the inverter 141 and 142 of the pulse level shifter 140 to prevent or reduce a short current will be more fully described below. For example, when the enable signal EN has a high level and the pulse P has a high level, the NMOS transistor NM1 is turned on and the conversion node CN transitions to a ground voltage, which may enable the PMOS transistor PM1b to be turned on. Since the NMOS transistor NM1b of the inverter 142 is at a turned-off state, a short current may be interrupted. In an embodiment where the inverted pulse Pb has a high level, the NMOS transistor NM1b is turned on and the inverted conversion node CNb transitions to a ground voltage, which may enable the PMOS transistor PM1 to be turned on. Since the NMOS transistor NM1 of the inverter 141 is at a turned-off state, a short current may be interrupted.

According to an exemplary embodiment of the invention, the pulse level shifter 140 may prevent a short current from flowing via a current path. Further, a period during which a short current is generated may be shortened. Referring to FIG. 2, an overlap period of the pulses P and Pb (e.g., a period where a short current is generated) may be short. For example, an overlap period may correspond to a delay time of the inverter 125.

In an embodiment, the output unit 160 is connected to the conversion node CN to output a pulse clock signal PCLK corresponding to a converted pulse. For example, the output unit 160 may invert a pulse output from the pulse level shifter 140 to generate the pulse clock signal PCLK. The output unit 160 may include a retention latch 162 and an output inverter 164. In an embodiment, a pulse output from the pulse level shifter 140 has the amplitude of the second power supply voltage VDDH.

In an embodiment, the retention latch 162 includes cross-coupled inverters 165 and 167 and retains a signal state of the conversion node CN.

In an embodiment, the output inverter 164 inverts a pulse from the conversion node CN to output it as the pulse clock signal PCLK. As discussed above, the pulse clock PCLK may have the amplitude of the second power supply voltage VDDH.

The clock gated circuit 100 according to an exemplary embodiment of the inventive concept may generate the pulses P and Pb to generate the pulse clock signal PCLK by including the pulse level shifter 140, which is configured to receive the pulses P and Pb and to differentially convert a level of the pulse P in response to the enable signal EN. Accordingly, the clock gated circuit 100 may operate with a reduced power consumption.

As a level shifter structure, the pulse level shifter 140 may enable a short current to flow only at a minimum period (e.g., a period where the pulses P and Pb have a high level at the same time), by receiving the pulses P and Pb and converting a level of the pulse P. Further, since a current path is formed by an inverter structure, the pulse level shifter 140 may prevent a short current from flowing via the current path.

Figure 3:
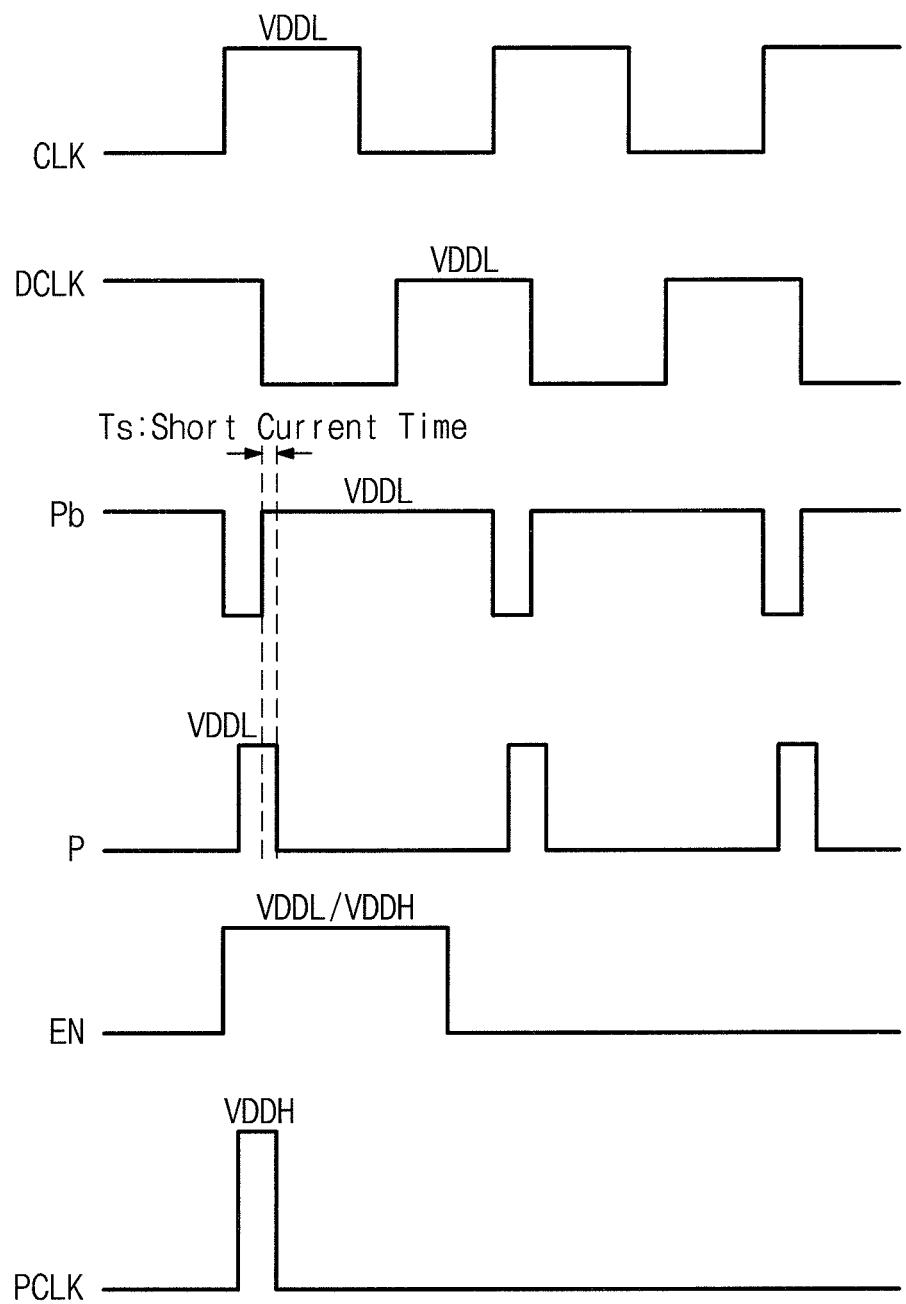
FIG. 3 is a timing diagram for describing a pulse clock generating method of a clock gated circuit in FIG. 2 according to an exemplary embodiment of the inventive concept.

FIG. 3 is a timing diagram for describing a pulse clock generating method of a clock gated circuit in FIG. 2 according to an exemplary embodiment of the inventive concept. The pulse clock generating method of the clock gated circuit will be more fully described below with reference to FIGS. 2 and 3. In an embodiment, a clock signal CLK is applied to a pulse generator 120. In an embodiment, a high level of the clock signal CLK has a first power supply voltage VDDL. In an embodiment, a delay clock signal DCLK is generated by an odd number of serially-connected inverters 121, 122, and 123. The delay clock signal DCLK may have a shape that corresponds to the clock signal CLK being inverted and delayed. In an embodiment, a high level of the delay clock signal DCLK has the first power supply voltage VDDL.

In an embodiment, the inverted pulse Pb is generated by NANDing the clock signal CLK and the delay clock signal DCLK via a logic circuit 124. In an embodiment, the pulse P is generated by inverting the inverted pulse Pb via an inverter 125. For example, the pulse P may be a signal obtained by inverting the inverted pulse Pb and delaying it by a predetermined time Ts. The pulses P and Pb may have a high level during the time Ts. In an embodiment, a high level of the pulse P has a first power supply voltage VDDL, and a high level of the inverted pulse Pb has the first power supply voltage VDDL. Periods of the pulses P and Pb may have the same period as the clock signal CLK.

In an embodiment, the pulse level shifter 140 converts a level of the pulse P into a second power supply voltage VDDH in response to an enable signal EN. A high level of the enable signal EN may have the first power supply voltage VDDL or the second power supply voltage VDDH. In an embodiment, a pulse clock signal PCLK corresponding to the converted pulse is output via the output unit 160. In an embodiment, a high level of the pulse clock PCLK has the second power supply voltage VDDH.

As illustrated in FIG. 3, an active interval (e.g., a high-level interval) of the pulse clock signal PCLK may be shorter than a half period of the clock signal CLK. However, the inventive concept is not limited thereto. For example, the active interval of the pulse clock signal PCLK may be set to be longer than a half period of the clock signal CLK.

According to an exemplary embodiment of the inventive concept, the pulse clock signal PCLK is generated by generating the pulse P according to an input of the clock signal CLK and converting a level of the pulse P.

The pulse generator 120 in FIG. 2 may generate a single pulse P during one period of the clock signal CLK. However, the inventive concept is not limited thereto. For example, the pulse generator 120 can be implemented to generate two or more pulses P during one period of the clock signal CLK.

Figure 4:
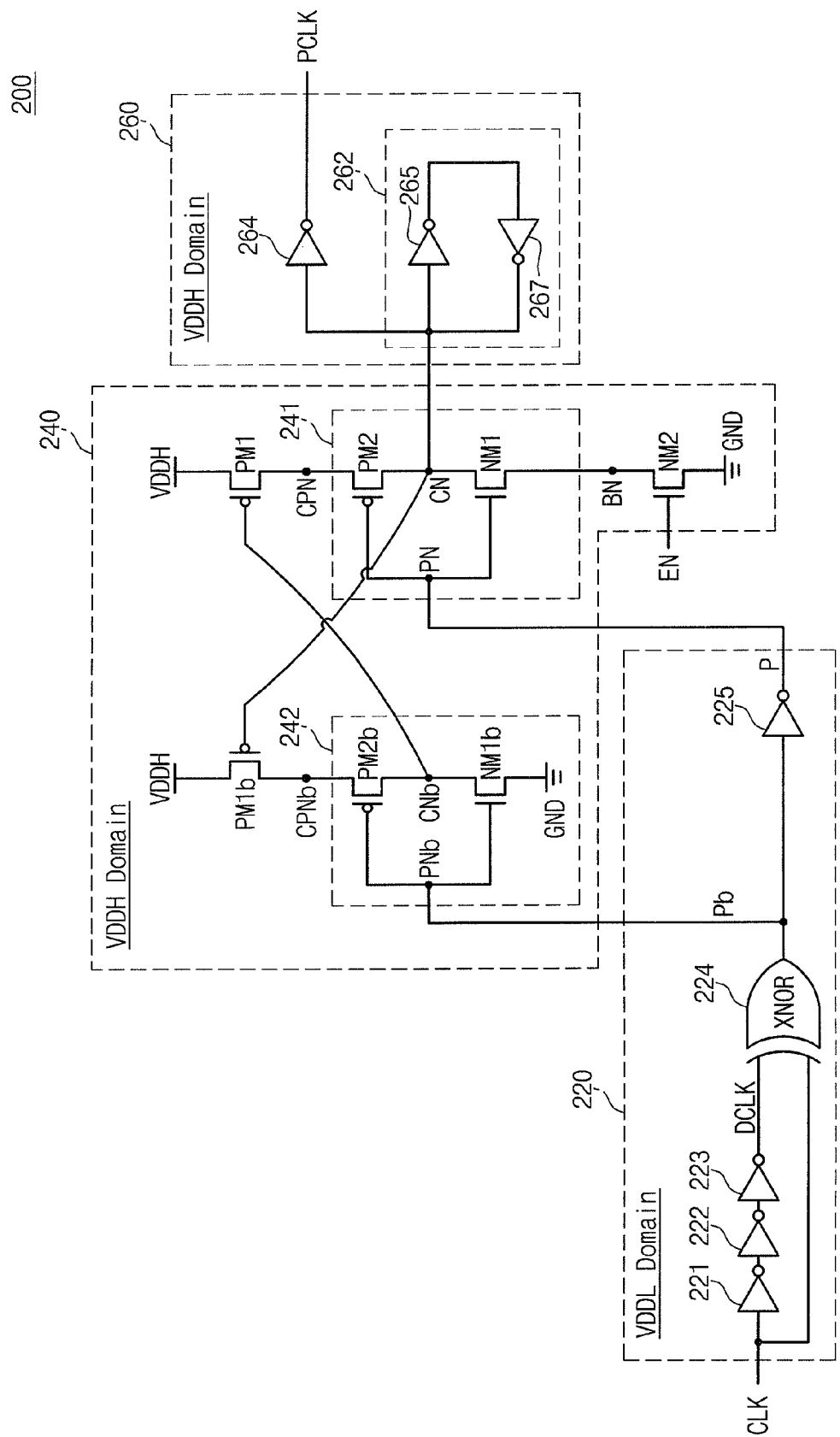
FIG. 4 is a circuit diagram illustrating a clock gated circuit in FIG. 1 according to an exemplary embodiment of the inventive concept.

FIG. 4 is a circuit diagram illustrating a clock gated circuit in FIG. 1 according to an exemplary embodiment of the inventive concept. Referring to FIG. 4, a clock gated circuit 200 includes a pulse generator 220, a pulse level shifter 240, and an output unit 260.

The pulse generator 220 may be configured to generate two pulses during one period of a clock signal CLK. The pulse generator 220 is similar to that the pulse generator 120 in FIG. 2 except for a logic circuit 224. In an embodiment, the pulse generator 220 includes a logic circuit 240 configured to XNOR a delay clock signal DCLK and the clock signal CLK.

The pulse level shifter 240 and the output unit 260 may be configured in manner similar to the pulse level shifter 140 and the output unit 160 in FIG. 2, respectively.

The clock gated circuit 200 generates a pulse by XNORing the clock CLK signal and the delay clock signal DCLK. Accordingly, the number of pulses generated by the clock gated circuit 200 during a period of the clock signal CLK is twice that of the clock gated circuit 100 of FIG. 2. For example, when a clock CLK signal with a same period is input, a frequency of the pulse clock signal PCLK output by the clock gated circuit 200 may be half a frequency of a pulse clock signal PCLK output by the clock gated circuit 100. The clock gated circuit 200 according to an exemplary embodiment of the inventive concept enables frequency scaling.

Figure 5:
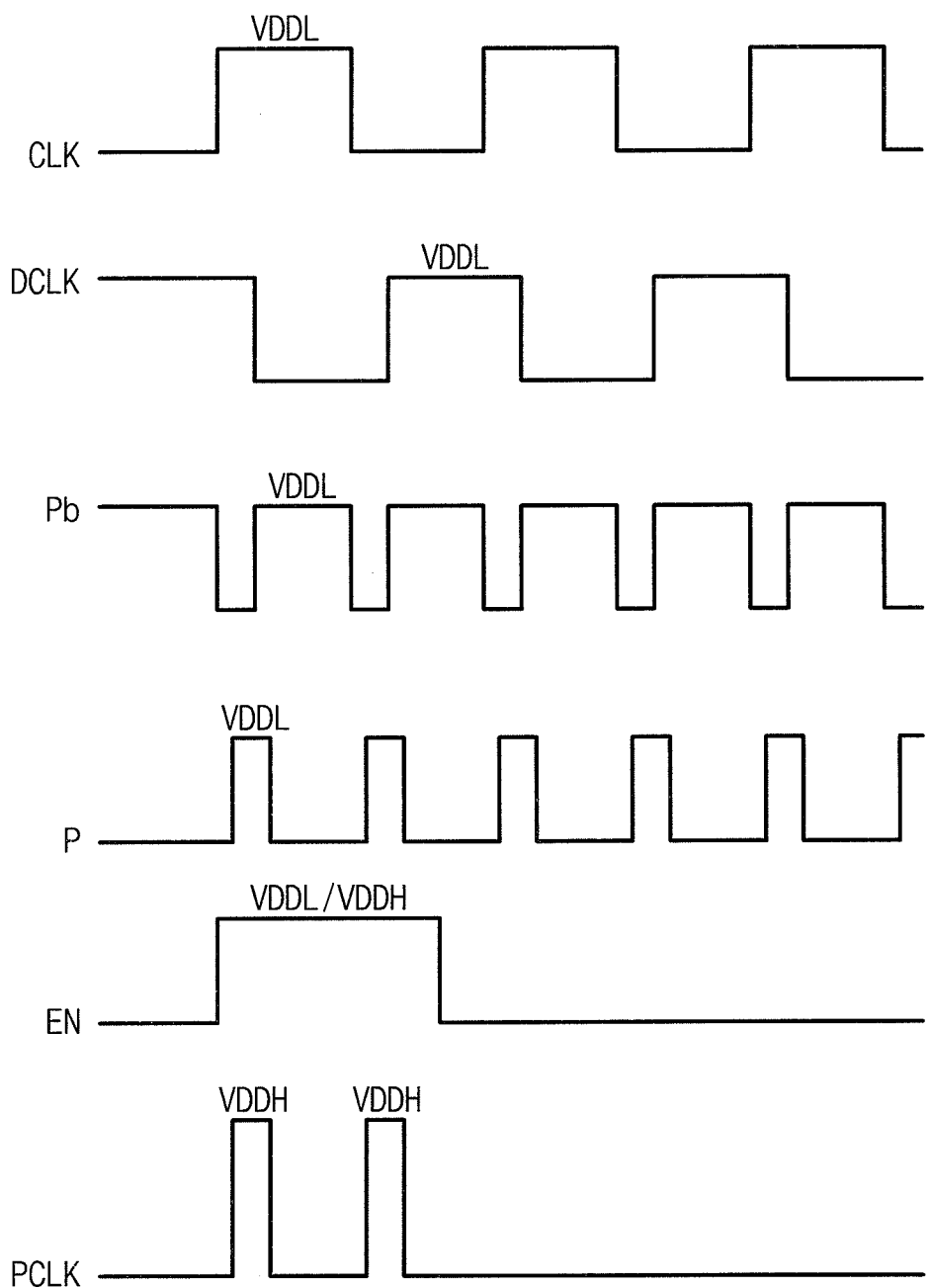
FIG. 5 is a timing diagram for describing a pulse clock generating method of a clock gated circuit in FIG. 4 according to an exemplary embodiment of the inventive concept.

FIG. 5 is a timing diagram for describing a pulse clock generating method of a clock gated circuit in FIG. 4 according to an exemplary embodiment of the inventive concept. The pulse clock generating method of the clock gated circuit will be more fully described below with reference to FIGS. 4 and 5. In an embodiment, a clock CLK signal is applied to a pulse generator 220. In an embodiment, a delay clock signal DCLK is generated by an odd number of serially-connected inverters 221, 222, and 223 of the pulse generator 220.

In an embodiment, an inverted pulse Pb is generated by XNORing the clock signal CLK and the delay clock signal DCLK by a logic circuit 224. In an embodiment, a pulse P is generated by inverting the inverted pulse Pb via an inverter 225. Periods of the pulses P and Pb may be a half period of the clock signal CLK.

In response to an enable signal EN, a pulse level shifter 240 may convert a level of the input pulse P into a second power supply voltage VDDH. In an embodiment, a pulse clock signal PCLK corresponding to the converted pulse is output via an output unit 260. As illustrated in FIG. 5, an active interval (e.g., a high-level interval) of each pulse the pulse clock signal PCLK may be shorter than a half period of the clock signal CLK.

The pulse clock signal PCLK may be generated by generating a pulse having double a frequency of an input clock signal CLK and converting a level of the pulse P.

Pulse level shifters 140 and 240 in FIGS. 2 and 4 may be configured to form a current path having an inverter structure. However, in alternate embodiments of the inventive concept, the current path may be formed without using an inverter structure.

Figure 6:
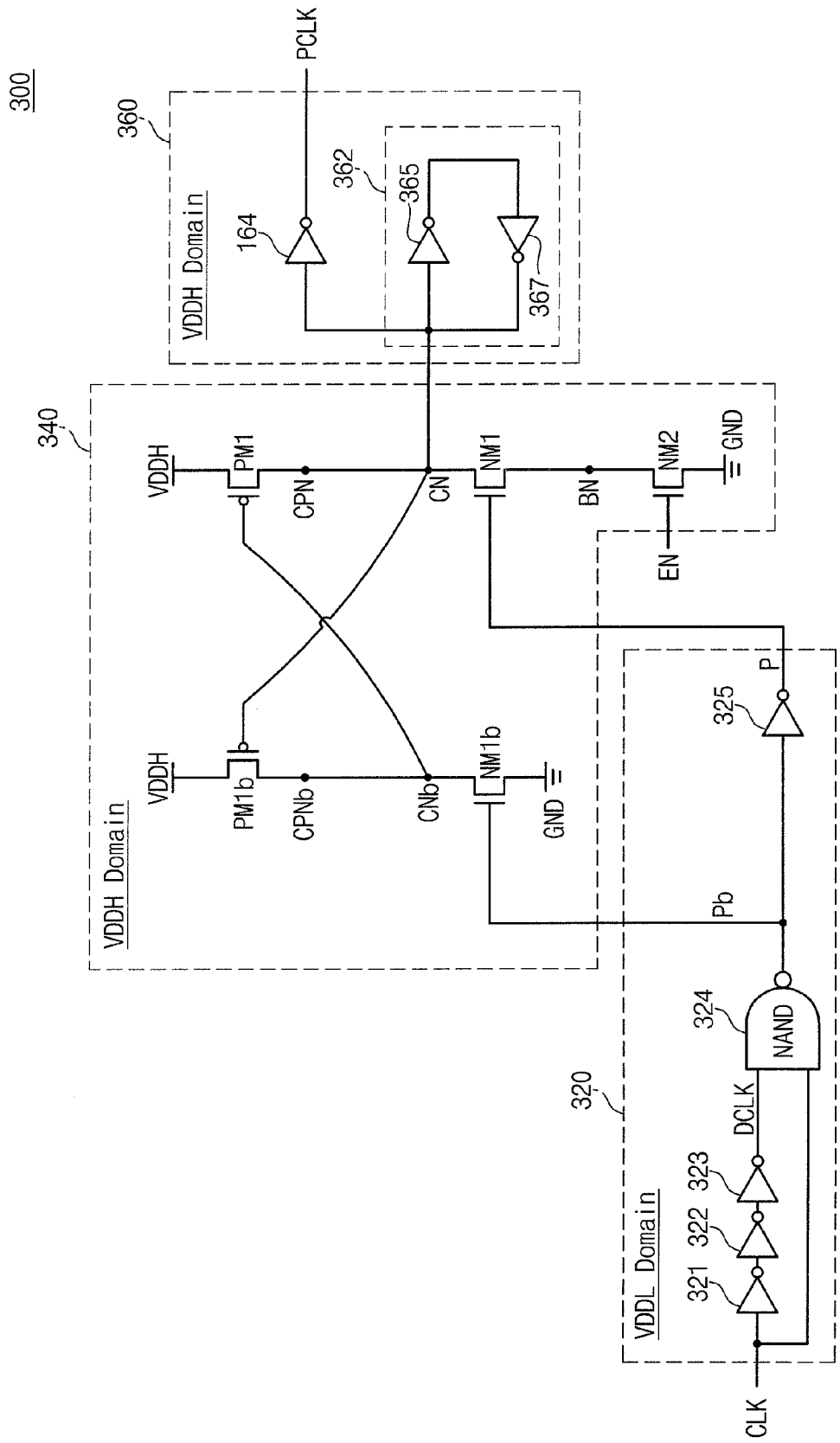
FIG. 6 is a circuit diagram illustrating a clock gated circuit in FIG. 1 according to still an exemplary embodiment of the inventive concept.

FIG. 6 is a circuit diagram illustrating a clock gated circuit in FIG. 1 according to still an exemplary embodiment of the inventive concept. Referring to FIG. 6, a clock gated circuit 300 includes a pulse generator 320, a pulse level shifter 340, and an output unit 360. The pulse generator 320 may be similar to the pulse generator 120 in FIG. 2, and the output unit 360 may be similar to the output unit 160 in FIG. 2.

The pulse level shifter 340 may have a level shifter structure. In an embodiment, the pulse level shifter 340 includes first and second PMOS transistors PM1 and PM1b and first to third NMOS transistors NM1, NM1b, and NM2. In an embodiment, the first PMOS transistor PM1 is connected between a power supply voltage VDDH and a conversion node CN, and the second PMOS transistor PM1b is connected between the power supply voltage VDDH and an inverted conversion node CNb. In an embodiment, the first NMOS transistor NM1 is connected between the conversion node CN and a bias node BN, and the second NMOS transistor NM1b is connected between the inverted conversion node CNb and a ground terminal GND. In an embodiment, the third NMOS transistor NM2 is connected between the bias node BN and the ground terminal GND.

In an embodiment, a gate of the first PMOS transistor PM1 is connected with the inverted conversion node CNb, a gate of the second PMOS transistor PM1b is connected with the conversion node CN, a gate of the first NMOS transistor NM1 is connected to receive the pulse P, a gate of the second NMOS transistor NM1b is connected to receive the inverted pulse Pb, and a gate of the third NMOS transistor NM2 is connected to receive an enable signal EN.

The clock gated circuit 300 according to an exemplary embodiment of the inventive concept generates a pulse clock signal PCLK by performing level conversion of the pulse P using the pulses P and Pb generated in response to the clock signal CLK. The clock gated circuit 300 according to an exemplary embodiment of the inventive concept may minimize a period where a short current flows, as compared with a typical gated circuit.

Figure 7:
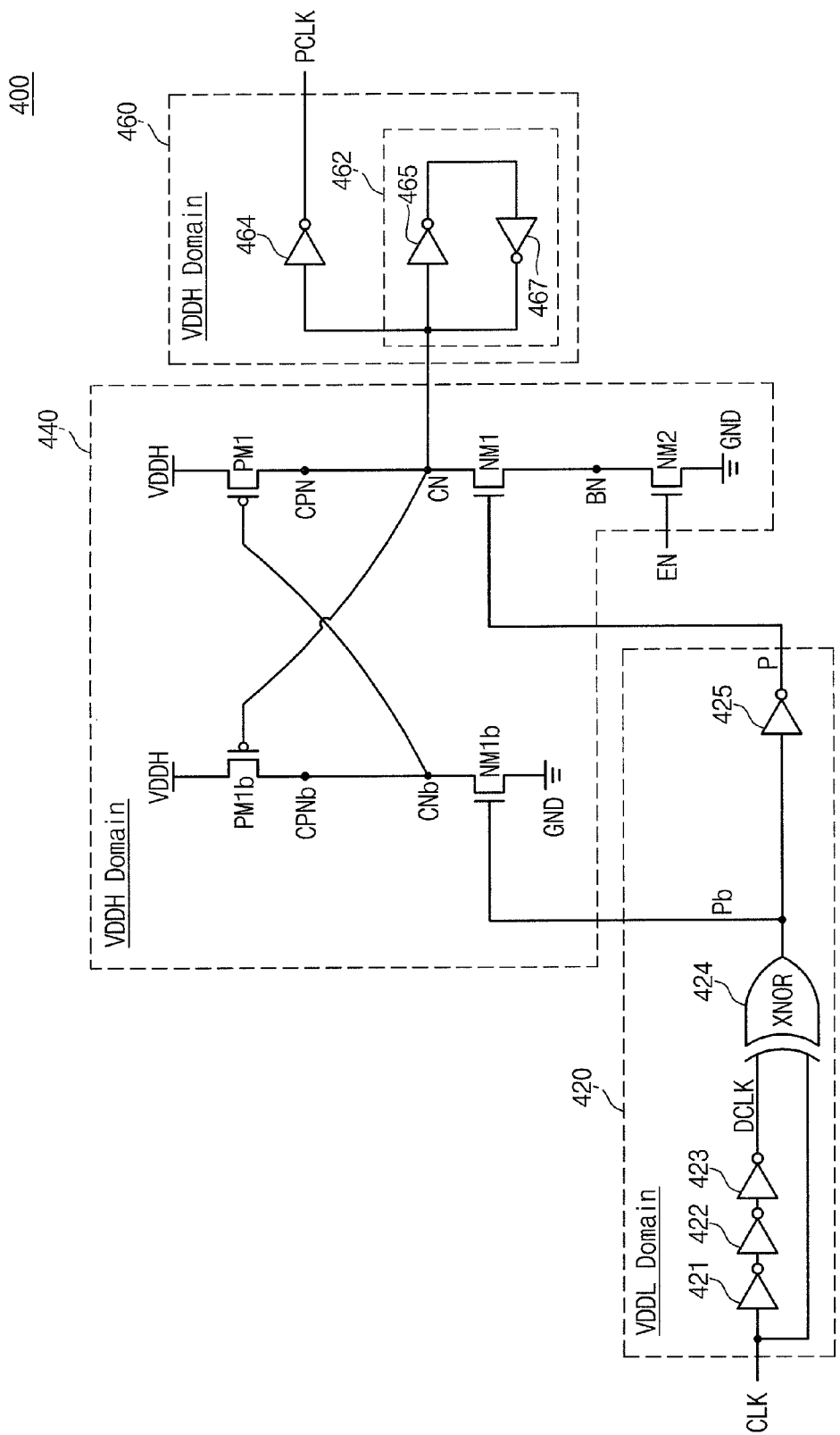
FIG. 7 is a circuit diagram illustrating a clock gated circuit in FIG. 1 according to still an exemplary embodiment of the inventive concept.

FIG. 7 is a circuit diagram illustrating a clock gated circuit in FIG. 1 according to an exemplary embodiment of the inventive concept. Referring to FIG. 7, a clock gated circuit 400 includes a pulse generator 420, a pulse level shifter 440, and an output unit 460. The pulse generator 420 may be the same as the pulse generator 220 in FIG. 4, and the output unit 460 may be that the same as the output unit 160 in FIG. 2.

The clock gated circuit 400 according to an exemplary embodiment of the inventive concept may generate a pulse clock signal PCLK by performing level conversion of a pulse P using pulses P and Pb generated in response to a clock signal CLK. The clock gated circuit 400 according to an exemplary embodiment of the inventive concept may minimize a period where a short current flows, as compared with a typical gated circuit.

The clock gated circuit 400 according to an exemplary embodiment of the inventive concept may generate a pulse clock signal PCLK by generating pulses P and Pb having double a frequency of that of a clock signal CLK and performing level conversion of the pulse P. The clock gated circuit 400 according to an exemplary embodiment of the inventive concept enables frequency scaling.

A pulse-based flip-flop may include a pulse clock generator for receiving a pulse clock. A clock gated circuit according to an exemplary embodiment of the inventive concept may be applicable to the pulse-based flip-flop. For example, a pulse-based flip-flop according to an exemplary embodiment of the inventive concept does not need a pulse clock generator, and may be configured to perform a latch operation using a pulse clock signal output from the clock gated circuit.

Figure 8:
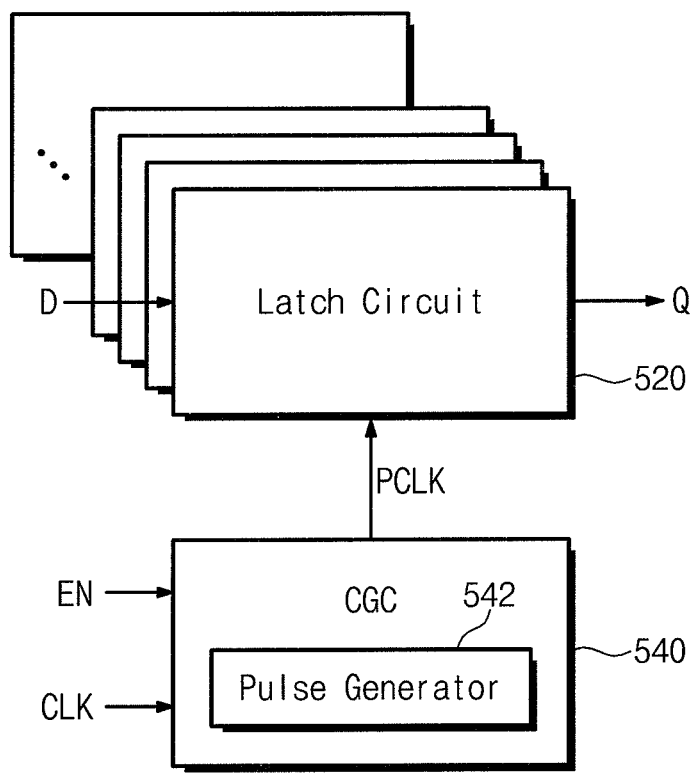
FIG. 8 is a block diagram illustrating pulse-based flip-flops according to an exemplary embodiment of the inventive concept.

FIG. 8 is a block diagram illustrating pulse-based flip-flops according to an exemplary embodiment of the inventive concept. Referring to FIG. 8, flip-flops 500 include a plurality of latch circuits 520 and one clock gated circuit 540.

In an embodiment, each of the plurality of latch circuits 520 samples an input signal D in response to a pulse clock signal PCLK to generate an output signal Q.

In an embodiment, the clock gated circuit 540 receives a clock signal CLK to generate a pulse clock signal PCLK in response to an enable signal EN. The clock gated circuit 540 may be configured the same as that in FIG. 1. For example, the clock gated circuit 540 may be replaced with any of the above described clock gated circuits. The clock gated circuit 540 may include a pulse generator 542, which is configured to generate a pulse P in response to the clock signal CLK.

A pulse-based flip-flop may be configured to include an individual pulse clock generator per latch circuit. The flip-flops 500 according to an exemplary embodiment of the inventive concept are configured such that the plurality of latch circuits 520 share one clock gated circuit 540. Since the latch circuits 520 share a clock gated circuit, power consumption and area may be reduced.

Figure 9:
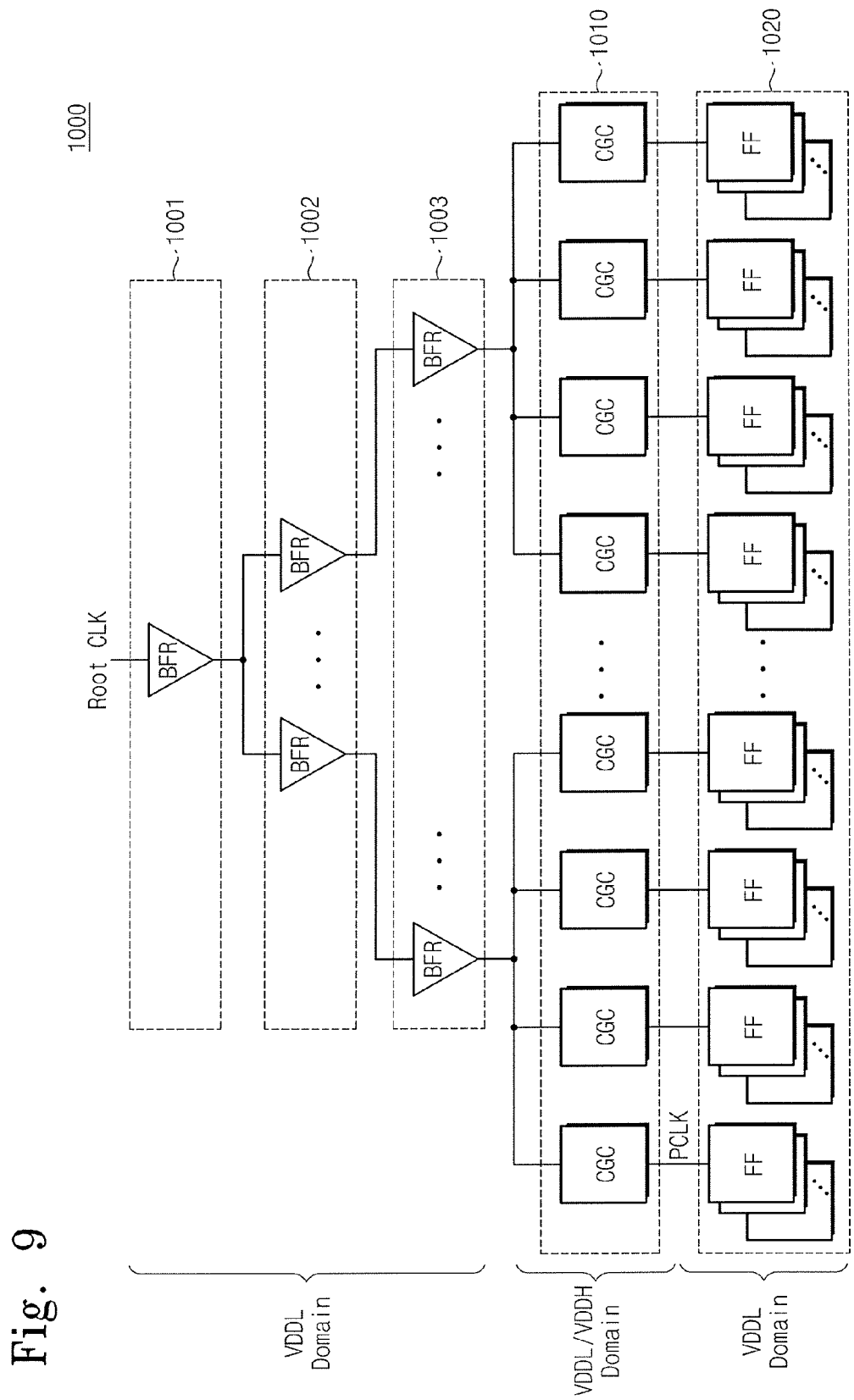
FIG. 9 is a diagram illustrating a clock network of a digital system according to an exemplary embodiment of the inventive concept.

FIG. 9 is a diagram illustrating a clock network of a digital system according to an exemplary embodiment of the inventive concept. Referring to FIG. 9, a digital system 1000 includes first to third clock buffer layers 1001 to 1003 configured to divide a root clock signal. For example, a clock signal output by each subsequent clock buffer layer may be a multiple of the frequency of an input clock signal. For example, if each clock buffer layer halves an input frequency, and the root clock signal is frequency F, the clock signals output by the first clock buffer layer 1001 would be F/2, the clock signals output by the second clock buffer 1002 would be F/4, and the clock signals output by the third clock buffer 1003 would be F/8. In another embodiment, dividing of the root clock signal means that several identical clock signals are generated by each subsequent clock buffer layer. For example, if each clock buffer layer generates two clock signals from each input clock signal, the first clock buffer layer 1001 would output two clock signals, the second clock buffer layer 1002 would output four clock signals, and the third clock buffer layer 1003 would output eight clock signals. While three clock buffer layers 1001, 1002, and 1003 are exemplarily shown in FIG. 9, the inventive concept is not limited thereto. For example, the digital system 1000 may be configured to include at least one clock buffer layer for providing a clock signal CLK to clock gated circuits via buffering of a root clock signal.

In an embodiment, a plurality of clock gated circuits 1010 are connected with the last clock buffer layer 1003. Each of the clock gated circuits 1010 may be connected with a plurality of flip-flops 1020.

As one pulse clock signal PCLK is shared by a plurality of flip-flops, the digital system 1000 may reduce power consumption as compared with a typical digital system.

Further, the digital system 1000 may reduce power consumption by driving the buffer layers 1001, 1002, and 1003 and a part of the clock gated circuits 1010. The digital system 1000 may improve the performance of a latch operation by driving a plurality of flip-flops 1020 using a second power supply voltage VDDH.

FIG. 10 is a flowchart for describing a pulse clock generating method of a clock gated circuit according to an exemplary embodiment of the inventive concept. The pulse clock generating method of the clock gated circuit will be more fully described below with reference to FIGS. 1 and 10.

In step S110, pulses P and Pb are generated using an input clock signal CLK. A period of the pulse P may be identical to that of the inverted pulse Pb or may be a half period of the clock signal CLK. In step S120, level conversion of the pulse P is performed in response to an enable signal EN. Upon level conversion, a short current generated by the pulses P and Pb does not flow via a current path. A level of the converted pulse may be higher than that of the pulse P. In step S130, a pulse clock signal PCLK corresponding to the level-converted pulse is output.

Although exemplary embodiments of the present invention have been shown and described, it will be appreciated that various changes may be made in these embodiments without departing from the spirit and scope of the disclosure.

What is claimed is:

1. A clock gated circuit comprising:
   a pulse generator driven by a first power supply voltage and configured to receive a clock signal and to generate a pulse and an inverted pulse with a level of the first power supply voltage; and
   a pulse level shifter driven by a second power supply voltage higher than the first power supply voltage and configured to receive the pulse and the inverted pulse with the first power supply level and to convert a level of the pulse in response to an enable signal,
   wherein the pulse level shifter comprises:
   a first PMOS transistor connected between the second power supply voltage and a current path node and having a gate connected to an inverted conversion node;
   a second PMOS transistor connected between the second power supply voltage and an inverted current path node and having a gate connected to a conversion node;
   a first inverter connected between the current path node and a bias node and configured to invert the pulse and to output the inverted result to the conversion node;
   a second inverter connected between the inverted current path node and a ground terminal and configured to invert the inverted pulse and to output the inverted result to the inverted conversion node; and
   an NMOS transistor connected between the bias node and the ground terminal and having a gate connected to receive the enable signal,
   wherein a terminal of the first inverter receives a ground voltage from the ground terminal when the enable signal is activated but does not receive the ground voltage from the ground terminal when the enable signal is deactivated, and
   wherein a terminal of the second inverter receives the ground voltage regardless of whether the enable signal is deactivated or activated,
   wherein an active interval of the enable signal is longer than a half period of the clock signal.

2. The clock gated circuit of claim 1, wherein the amplitude of the clock signal is the same as the first power supply voltage.

3. The clock gated circuit of claim 2, wherein the amplitude of the enable signal is the same as the second power supply voltage.

4. The clock gated circuit of claim 2, wherein the amplitude of the enable signal is the same as the first power supply voltage.

5. The clock gated circuit of claim 2, wherein the amplitude of the converted pulse is the same as the second power supply voltage.

6. The clock gated circuit of claim 1, wherein the pulse generator comprises:
   a plurality of inverters connected in series and configured to generate a delay clock signal by delaying the clock signal;
   a logic circuit configured to output an inverted pulse by NANDing the clock signal and the delay clock signal; and
   an inverter configured to output the pulse by inverting the inverted pulse.

7. The clock gated circuit of claim 6, wherein the pulse level shifter interrupts a current path at an overlap period of the pulse and the inverted pulse.

8. The clock gated circuit of claim 1, wherein the pulse generator comprises:
   a plurality of inverters connected in series and configured to generate a delay clock signal by delaying the clock signal;
   a logic circuit configured to output the inverted pulse by XNORing the clock signal and the delay clock signal; and
   an inverter configured to output the pulse by inverting the inverted pulse.

9. The clock gated circuit of claim 1, wherein a high-level period of the pulse is shorter than a half period of the clock signal.

10. The clock gated circuit of claim 9, wherein a high-level period of the enable signal is shorter than a period of the clock signal.

11. The clock gated circuit of claim 1,
    wherein the first inverter comprises a first NMOS transistor connected between the conversion node and the bias node and having a gate connected to receive the pulse; and
    wherein the second inverter comprises a second NMOS transistor connected between the inverted conversion node and the ground terminal and having a gate connected to receive the inverted pulse.

12. The clock gated circuit of claim 11, wherein a high-level interval of the enable signal is longer than a half period of the clock.

13. The clock gated circuit of claim 1, further comprising:
    an output unit configured to output a pulse clock signal corresponding to the converted pulse.

14. A clock gated circuit comprising:
    a pulse generator configured to receive a clock signal to output first and second pulses with a first power supply voltage level, wherein the second pulse is the first pulse inverted and delayed, and a high-level period of the second pulse is shorter than a half period of the clock signal; and
    a pulse level shifter configured to receive the first and second pulses with the first power supply voltage level to output a pulse clock signal having a second voltage higher than the first power supply voltage level,
    wherein the pulse level shifter comprises:
    a first PMOS transistor connected between the second power supply voltage and a current path node and having a gate connected to an inverted conversion node;
    a second PMOS transistor connected between the second power supply voltage and an inverted current path node and having a gate connected to a conversion node;
    a first inverter connected between the current path node and a bias node and configured to invert the pulse and to output the inverted result to the conversion node;
    a second inverter connected between the inverted current path node and a ground terminal and configured to invert the inverted pulse and to output the inverted result to the inverted conversion node; and a first NMOS transistor connected between the bias node and the ground terminal and having a gate connected to receive an enable signal, wherein a terminal of the first inverter receives a ground voltage from the ground terminal when the enable signal is activated but does not receive the ground voltage from the ground terminal when the enable signal is deactivated, and a terminal of the second inverter receives the ground voltage regardless of whether the enable signal is deactivated or activated, wherein an active interval of the enable signal is longer than a half period of the clock signal.

15. The clock gate circuit of claim 14, wherein the pulse level shifter performs a level shifting in response to receipt of the enable signal having a high level for a period greater than a half period of the clock signal.

16. The clock gated circuit of claim 15, wherein the first PMOS transistor and the first inverter are connected in series between the second voltage and the ground voltage;

wherein the second PMOS transistor, the second inverter, and the first NMOS transistor are connected in series between the second voltage and the ground voltage, wherein a gate of the first PMOS transistor is connected to an output of the second inverter and a gate of the second PMOS transistor is connected to an output of the first inverter, wherein the first pulse is output to an input of the first inverter, the second pulse is output to an input of the second inverter, and wherein the enable signal is output to the gate of the first NMOS transistor.

17. The clock gated circuit of claim 15, wherein the second inverter comprises a third PMOS transistor and a second NMOS transistor connected in series between the second voltage and the ground voltage, wherein the first inverter comprises a fourth PMOS transistor and a third NMOS transistor connected in series, and the first NMOS transistor is connected in series between the third NMOS transistor and the ground voltage, wherein the gate of the first PMOS transistor is connected to an output terminal of the fourth PMOS transistor and an input terminal of the third NMOS transistor, wherein the gate of the second PMOS transistor is connected to an output terminal of the third PMOS transistor and an input terminal of the second NMOS transistor, wherein the first pulse is output to a gate of the second NMOS transistor and the second pulse is output to a gate of the third NMOS transistor, and wherein the enable signal is output to the gate of the first NMOS transistor.

18. The clock gated circuit of claim 1, where the pulse generator generates the pulse and the inverted pulse at both a rising edge and a falling edge of the clock signal.

19. The clock gated circuit of claim 14, where the pulse generator generates the first and second pulses at both a rising edge and a falling edge of the clock signal.

* * * * *